(12) United States Patent
Shim et al.

(10) Patent No.: US 9,384,846 B1
(45) Date of Patent: Jul. 5, 2016

(54) SEMICONDUCTOR MEMORY DEVICE, MEMORY SYSTEM INCLUDING THE SAME, AND OPERATING METHOD THEREOF

(71) Applicant: SK hynix Inc., Icheon-si Gyeonggi-do (KR)

(72) Inventors: Keon Soo Shim, Icheon-si (KR); Bong Yeol Park, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/792,920

(22) Filed: Jul. 7, 2015

(30) Foreign Application Priority Data

Feb. 3, 2015 (KR) ......................... 10-2015-0016758

(51) Int. Cl.
  *G11C 7/04* (2006.01)
  *G11C 16/26* (2006.01)
  *G11C 16/04* (2006.01)

(52) U.S. Cl.
  CPC ............ *G11C 16/26* (2013.01); *G11C 16/0483* (2013.01)

(58) Field of Classification Search
  USPC ........................................................ 365/211
  See application file for complete search history.

(56) References Cited

U.S. PATENT DOCUMENTS

| 5,680,359 | A | * | 10/1997 | Jeong | ................... | G11C 11/406 365/189.07 |
| 2010/0008151 | A1 | * | 1/2010 | Hwang | ............... | G06F 11/1068 365/185.22 |
| 2010/0110815 | A1 | * | 5/2010 | Lee | ......................... | G11C 5/143 365/211 |
| 2011/0314204 | A1 | * | 12/2011 | Ootsuka | .............. | G06F 12/0246 711/103 |
| 2013/0223143 | A1 | * | 8/2013 | Cho | .................... | G11C 16/0483 365/185.03 |

FOREIGN PATENT DOCUMENTS

KR    1020130117555 A    10/2013
KR    1020140065185 A    5/2014

* cited by examiner

*Primary Examiner* — Hoai V Ho
*Assistant Examiner* — Minh Dinh
(74) *Attorney, Agent, or Firm* — William Park & Associates Ltd.

(57) ABSTRACT

Disclosed are a semiconductor memory device, a memory system including the same, and an operating method thereof. The memory system includes: a semiconductor memory device including a plurality of memory chips; and a controller configured to measure a cell current of each of the plurality of memory chips, generate temperature compensation data corresponding to the measured cell current, and store the generated temperature compensation data in each of the plurality of memory chips.

18 Claims, 7 Drawing Sheets

Cross Temp Vt Shift: Sample 1 < Sample2

SEMICONDUCTOR MEMORY DEVICE, MEMORY SYSTEM INCLUDING THE SAME, AND OPERATING METHOD THEREOF

CROSS-REFERENCE TO RELATED APPLICATION

The present application claims priority to Korean patent application number 10-2015-0016758 filed on Feb. 3, 2015, in the Korean Intellectual Property Office, the entire disclosure of which is incorporated by reference herein.

BACKGROUND

1. Technical Field

The invention relates to an electronic device, and more particularly, to a semiconductor memory device, a memory system including the same, and an operating method thereof.

2. Related Art

A semiconductor memory device is generally classified into a volatile memory device and a nonvolatile memory device.

The volatile memory device has a high write and read rate, but stored data dissipates when a power supply is blocked. The nonvolatile memory device has a relatively low write and read rate, but stored data is maintained even though a power supply is blocked. Accordingly, the nonvolatile memory device is used in order to store data which needs to be maintained regardless of the power supply. The nonvolatile memory device includes a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

The flash memory has an advantage of the RAM that data is freely programmed and erased, and an advantage of the ROM that stored data can be maintained even though a power supply is blocked. The flash memory is widely used as a storage medium of a portable electronic device, such as a digital camera, a Personal Digital Assistant (PDA), and an MP3 player.

SUMMARY

An embodiment of the invention provides a memory system, including a semiconductor memory device including a plurality of memory chips. The memory system may also include a controller configured to measure a cell current of each of the plurality of memory chips, generate temperature compensation data corresponding to the measured cell current, and store the generated temperature compensation data in each of the plurality of memory chips.

An embodiment of the invention provides a semiconductor memory device, including a plurality of memory chips. Each of the plurality of memory chips includes a memory cell array including a plurality of memory blocks. Each of the plurality of memory chips includes a peripheral circuit configured to measure a cell current of a selected memory block among the plurality of memory cell blocks, and store temperature compensation data in one or more of the plurality of memory cell blocks. Each of the plurality of memory chips includes a control logic configured to generate the temperature compensation data according to the measured cell current, and control the peripheral circuit to program the generated temperature compensation data in one or more of the plurality of memory cell blocks.

An embodiment of the invention provides a method of a memory system, including measuring a cell current for each of a plurality of memory chips. The operating method also includes generating temperature compensation data corresponding to each of the plurality of memory chips according to the measured cell current. The operating method also includes storing the temperature compensation data in each of the plurality of memory chips. Further, the operating method includes reading the temperature compensation data stored in each of the plurality of memory chips, setting a read voltage of each of the plurality of memory chips according to the read temperature compensation data, and performing the read operation.

DETAILED DESCRIPTION

Advantages and features of the invention and methods of achieving the advantages and features will be clear with reference to embodiments described in detail below together with the accompanying figures. However, the invention is not limited to the embodiments described herein, and may be implemented in various different forms. The embodiments are provided so as to fully describe the invention so that those skilled in the art may easily carry output the technical spirit of the invention. The invention has been made in an effort to provide a semiconductor memory device capable of improving reliability of a read operation by accurately reading data during the read operation, and a memory system including the same, and an operating method thereof. The foregoing summary is illustrative only and is not intended to be in any way limiting. According to various embodiments of the invention, it is possible to improve reliability of a read operation by predicting threshold voltage variation amounts of the memory cells according to a temperature by measuring a cell current of each of the plurality of semiconductor memory chips included in the memory system, and adjusting a read voltage of each semiconductor memory chip according to the measured cell current. In addition to the illustrative aspects, embodiments, and features described above, further aspects, embodiments, and features will become apparent by reference to the drawings and the following detailed description.

Throughout this specification and the claims that follow, when it is described that an element is "coupled" to another element, the element may be "directly electrically coupled" to the other element or "indirectly electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
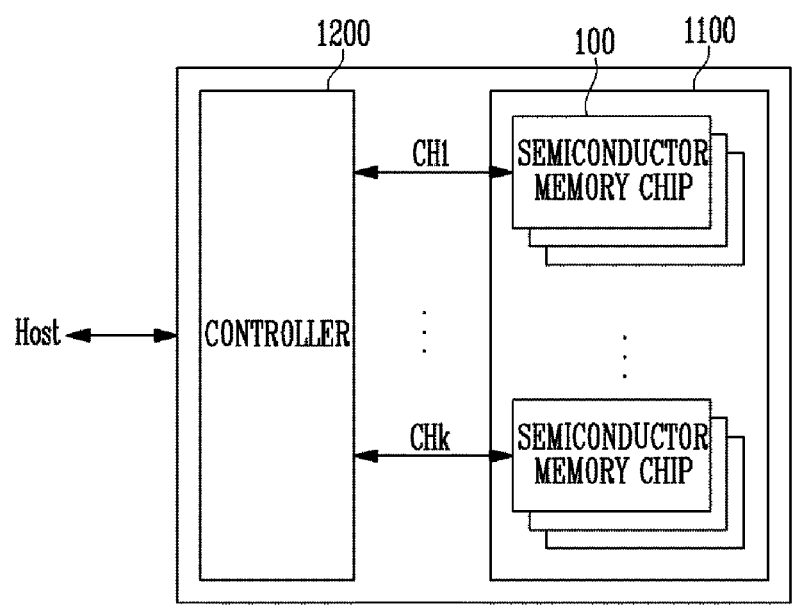
FIG. 1 is a block diagram illustrating a memory system according to an embodiment of the invention.

Referring to FIG. 1, a block diagram illustrating a memory system according to an embodiment of the invention is described.

In FIG. 1, a memory system 1000 includes a semiconductor memory device 1100 and a controller 1200. The semiconductor memory device 1100 includes a plurality of semiconductor memory chips 100. The plurality of semiconductor memory chips 100 is divided into a plurality of groups.

In FIG. 1, it is illustrated that the plurality of groups communicates with the controller 1200 through first to $k^{th}$ channels CH1 to CHk, respectively. A detailed configuration of each semiconductor memory chip will be described below.

Each group is configured to communicate with the controller 1200 through one common channel. The controller 1200 is configured to control the plurality of memory chips 100 of the semiconductor memory device 1100 through the plurality of channels CH1 to CHk.

Further, the controller 1200 makes a control to set temperature compensation data according to cell current information about each of the semiconductor memory chips 100 included in the semiconductor memory device 1100 and store the set temperature compensation data in each of the semiconductor memory chips 100. Further, the controller 1200 reads the temperature compensation data stored in each semiconductor memory chip 100 when a read operation command is input. The controller 1200 also sets a read voltage used during a read operation of each semiconductor memory chip 100 according to the read temperature compensation data and a current operation temperature of each semiconductor memory chip 100.

The controller 1200 and the semiconductor memory device 1100 may be integrated into one semiconductor device. In an embodiment, the controller 1200 and the semiconductor memory device 1100 may be integrated into one semiconductor device to configure a memory card. For example, the controller 1200 and the nonvolatile memory device 1100 may be integrated as one semiconductor device to configure a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1200 and the semiconductor memory device 1100 may be integrated into one semiconductor device to configure a semiconductor drive (Solid State Drive (SSD)). The semiconductor drive (SSD) includes a storage device configured to store data in a semiconductor memory. Where the memory system 1000 is used as the SSD, a speed of the operation of the host electrically coupled to the memory system 1000 is remarkably improved.

For another example, the memory system 1000 is provided as one of various constituent elements of an electronic device, such as a computer, an ultra mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various constituent elements devices configuring a computing system.

In an embodiment, the semiconductor memory device 1100 or the memory system 1000 may be mounted in various types of package. For example, the semiconductor memory device 1100 or the memory system 1000 may be packaged and mounted by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 2:
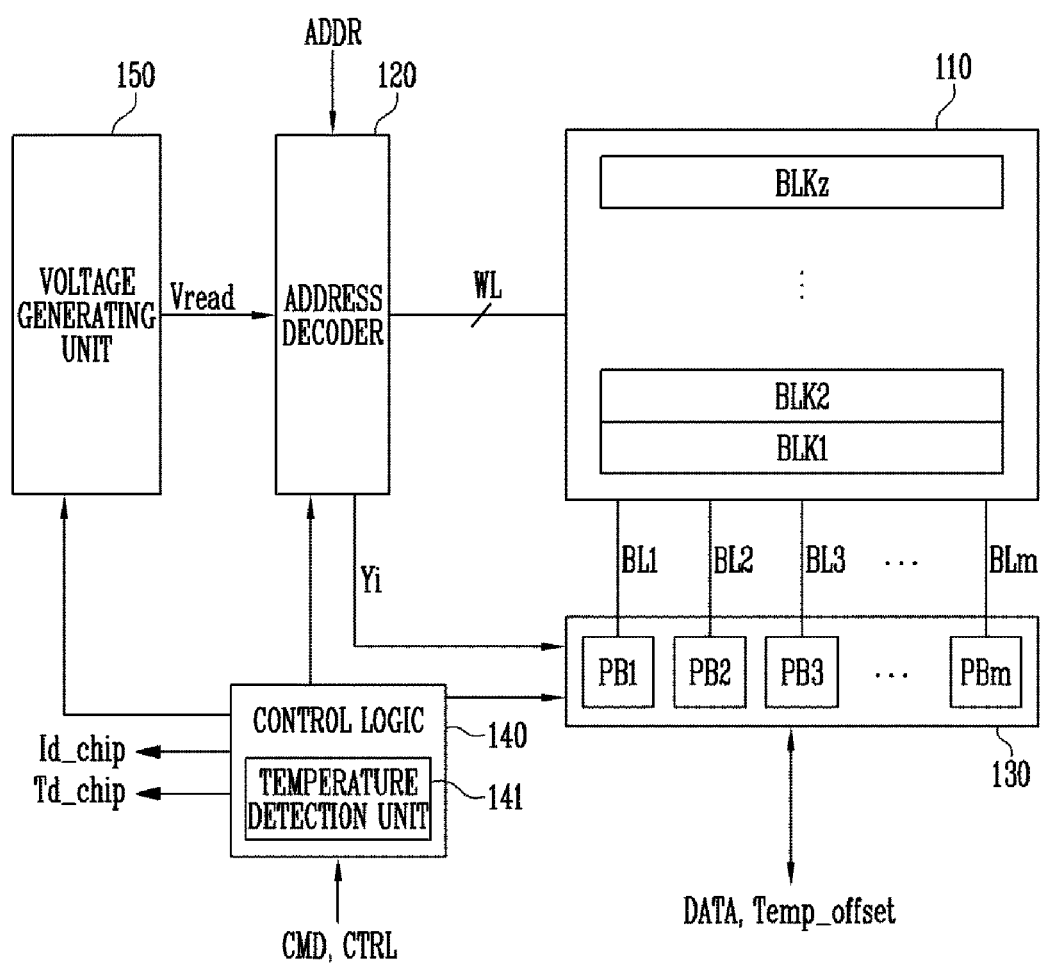
FIG. 2 is a block diagram for describing a semiconductor memory chip of FIG. 1.

Referring to FIG. 2, a block diagram for describing a semiconductor memory chip of FIG. 1 is described.

In FIG. 2, the semiconductor memory chip 100 includes a memory cell array 110, an address decoder 120, a read and write circuit 130, a control logic 140, and a voltage generator 150.

The memory cell array 110 includes a plurality of memory blocks BLK1 to BLKz. The plurality of memory blocks BLK1 to BLKz is electrically coupled to the address decoder 120 through word lines WL. The plurality of memory blocks BLK1 to BLKz is electrically coupled to the read and write circuit 130 through bit lines BL1 to BLm. Each of the memory blocks BLK1 to BLKz includes the plurality of memory cells. In an embodiment, the plurality of memory cells is a nonvolatile memory cell. Memory cells electrically coupled to the same word line among the plurality of memory cells are defined as one page. The memory cell array 110 is formed of a plurality of pages.

Further, each of the plurality of memory blocks BLK1 to BLKz of the memory cell array 110 includes a plurality of cell strings. Each of the plurality of cell strings includes a drain selection transistor serially connected between the bit line and the source line, a first memory cell group, a pipe transistor, a second memory cell group, and a source selection transistor. In an embodiment, the memory cell array 110 may be configured in a vertical memory cell array having a three-dimensional structure.

The memory cell array 110 may be configured to include a CAM cell unit including CAM cells. Temperature compensation data Temp_offset determined according to a cell current of the semiconductor memory chip is stored in the CAM cell unit.

The address decoder 120, the read and write circuit 130, and the voltage generator 150 are operated as peripheral circuits for driving the memory cell array 110.

The address decoder 120 is electrically coupled to the memory cell array 110 through the word lines WL. The address decoder 120 is configured to be operated in response to a control by the control logic 140. The address decoder 120 receives an address ADDR through an input/output buffer inside the semiconductor memory device 100.

The address decoder 120 applies a read voltage Vread generated by the voltage generator 150 to a selected word line among the word lines of the selected memory block during the read operation. The address decoder 120 also applies a program voltage generated by the voltage generator 150 during a program operation to a selected word lines among the word lines of the selected memory block.

The read and program operations of the semiconductor memory chip 100 are performed in the unit of the page. The address ADDR received when the read and program operations are requested includes a block address, a row address, and a column address. The address decoder 120 selects one memory block and one word line according to the block address and the row address. The column address is decoded by the address decoder 120 to be provided to the read and write circuit 130.

The read and write circuit 130 includes a plurality of page buffers PB1 to PBm. The plurality of page buffers PB1 to PBm is electrically coupled to the memory cell array 110 through the bit lines BL1 to BLm. Each of the plurality of page buffers PB1 to PBm may sense a current quantity flowing through the memory strings included in the memory cell array 110 through each bit line during a cell current sensing operation, and output the sensed current quantity to the control logic 140 as cell current information. Further, each of the plurality of page buffers PB1 to PBm senses a program state of a corresponding memory cell during the read operation and outputs the sensed program state as read data. Further, the read and write circuit 130 programs the temperature compensation data Temp_offset read from the controller 1200 in the CAM cell unit of the memory cell array 110. The read and write circuit 130 also reads the programmed temperature compensation data Temp_offset and outputs the read temperature compensation data Temp_offset to the controller 1200 during the read operation.

The read and write circuit 130 is operated in response to a control by the control logic 140.

In an embodiment, the read and write circuit 130 may include the page buffers (or page registers), a column selection circuit, and the like.

The control logic 140 is electrically coupled to the address decoder 120, the read and write circuit 130, and the voltage generator 150. The control logic 140 receives a command CMD and a control signal CTRL from the controller 1200 of FIG. 1 through the input/output buffer of the semiconductor memory chip 100. The control logic 140 is configured to control a general operation of the semiconductor memory chip 100 in response to the command CMD and the control signal CTRL.

The control logic 140 outputs cell current information Id_chip received from the read and write circuit 130 to the controller 1200 during the cell current sensing operation. Further, the control logic 140 controls the address decoder 120, the read and write circuit 130, and the voltage generator 150 to store the temperature compensation data Temp_offset received from the controller 1200 in the CAM cell unit of the memory cell array 110.

The control logic 140 may be configured to include a temperature detector 141. The temperature detector 141 senses a current operation temperature of the semiconductor memory chip 100 and outputs temperature information Td_chip to the controller 1200.

Further, the control logic 140 controls the voltage generator 150 in response to the control signal CTRL. The control logic 140 also adjusts a potential level of the read voltage Vread during the read operation.

The voltage generator 150 generates a read voltage Vread to be applied to the selected memory block during the read operation. In this case, a potential level of the read voltage Vread is varied under the control of the control logic 140.

Figure 3:
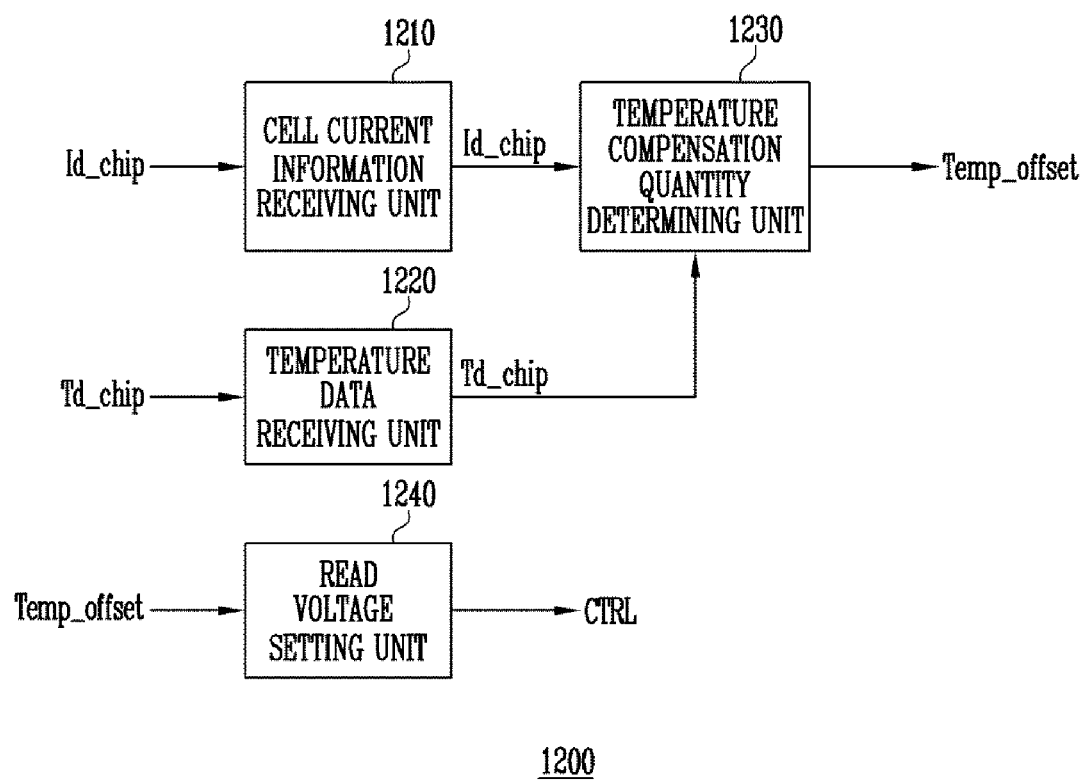
FIG. 3 is a detailed block diagram of a controller illustrated in FIG. 1.

Referring to FIG. 3, a detailed block diagram of the controller illustrated in FIG. 1 is described.

In FIG. 3, the controller 1200 includes a cell current information receiving unit 1210, a temperature data receiving unit 1220, a temperature compensation quantity determining unit 1230, and a read voltage setting unit 1240.

The cell current information receiving unit 1210 receives cell current information Id_chip about each chip received from each semiconductor memory chip included in the semiconductor memory device 1100. The cell current information receiving unit 1210 also temporarily stores the received cell current information Id_chip.

The temperature data receiving unit 1220 receives temperature information Td_chip about each chip received from each semiconductor memory chip included in the semiconductor memory device 1100 and temporarily stores the received temperature information Td_chip.

The temperature compensation quantity determining unit 1230 receives cell current information Id_chip about each semiconductor memory chip temporarily stored in the cell current information receiving unit 1210. The temperature compensation quantity determining unit 120 also determines a temperature compensation quantity corresponding to the received cell current information Id_chip, and outputs temperature compensation data Temp_offset corresponding to each semiconductor memory chip.

Further, the temperature compensation quantity determining unit 1230 may receive temperature data Td_chip about each semiconductor memory chip and corrects the temperature compensation data Temp_offset again.

The read voltage setting unit 1240 sets a read voltage according to the re-corrected temperature compensation data Temp_offset output from the temperature compensation quantity determining unit 1230 and outputs a control signal CTRL corresponding to the set read voltage.

Figure 4:
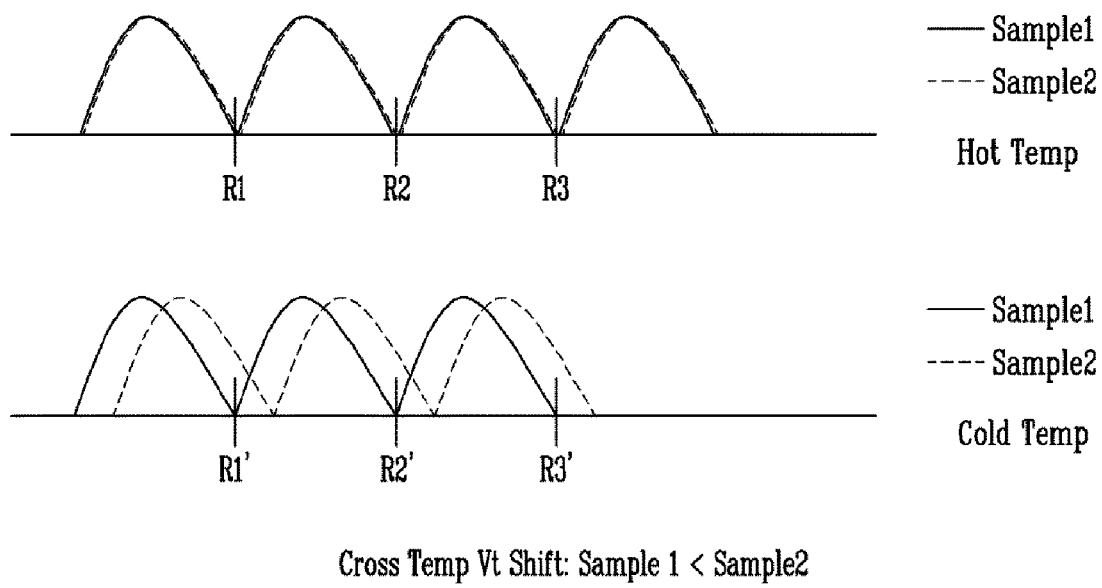
FIG. 4 is a threshold voltage distribution diagram for describing a threshold voltage distribution variation amount at a high temperature and a low temperature.

Referring to FIG. 4, a threshold voltage distribution diagram for describing a threshold voltage distribution variation amount of the memory cells at a high temperature and a low temperature is described.

In FIG. 4, a threshold voltage variation amount of a first memory chip Sample1 is similar to a threshold voltage variation amount of a second memory chip Sample2 at a high temperature, so that even though the same read voltages R1, R2, and R3 are used during the read operation, a read operation error is little generated. However, a threshold voltage variation amount of a first memory chip Sample1 is different from a threshold voltage variation amount of a second memory chip Sample2 at a low temperature, so that when read voltages R1', R2', and R3' optimized to the first memory chip Sample1 are used for the read operation of the second memory chip Sample2, a read operation error is generated. FIG. 4 also illustrates a cold temperature Cold Temp and a Hot Temperature Hot Temp.

Figure 5:
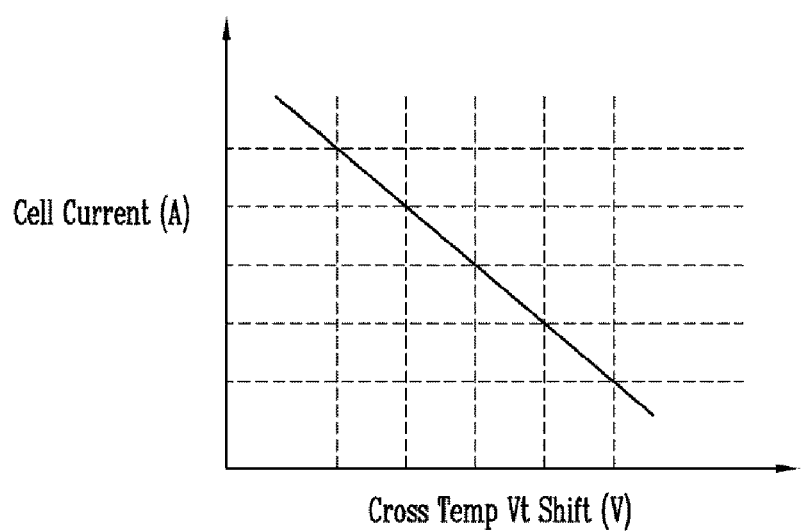
FIG. 5 is a graph for describing a relation of a threshold voltage distribution variation amount according to a cell current and a temperature.

Referring to FIG. 5, a graph for describing a relation of a threshold voltage distribution variation amount according to a cell current and a temperature is described.

In FIG. 5, a threshold voltage variation amount (Cross temp Vt Shift) according to a temperature is proportion to a cell current. Accordingly, it is possible to predict a threshold voltage variation amount (Cross temp Vt Shift) according to a temperature by measuring a cell current of the semiconductor memory chip.

Figure 6:
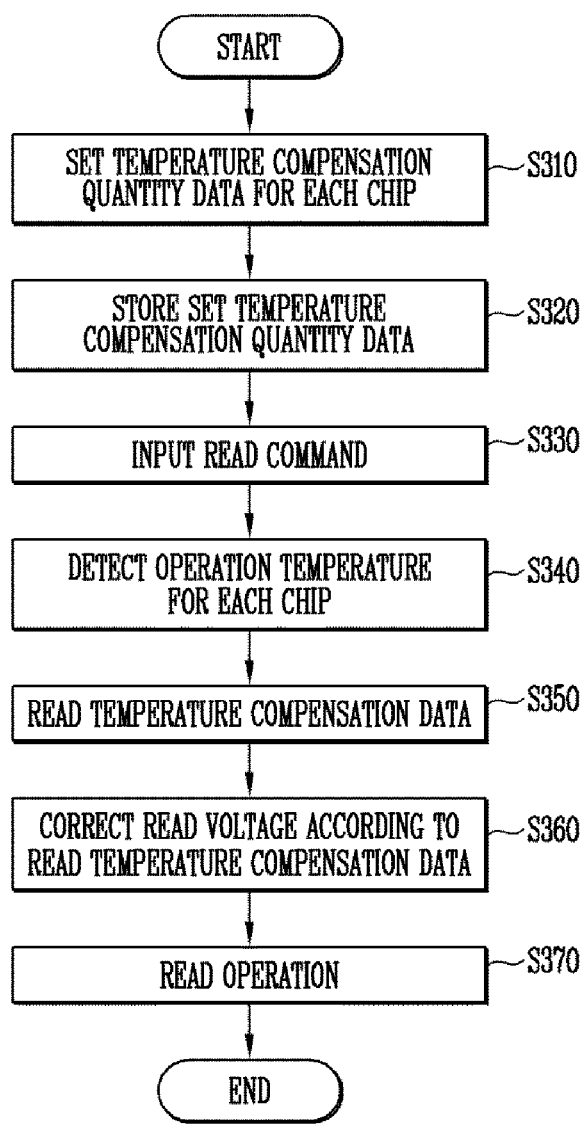
FIG. 6 is a flowchart illustrating an operating method of the memory system according to an embodiment of the invention.

Referring to FIG. 6, a flowchart illustrating an operating method of the memory system according to an embodiment of the invention is described.

Figure 7:
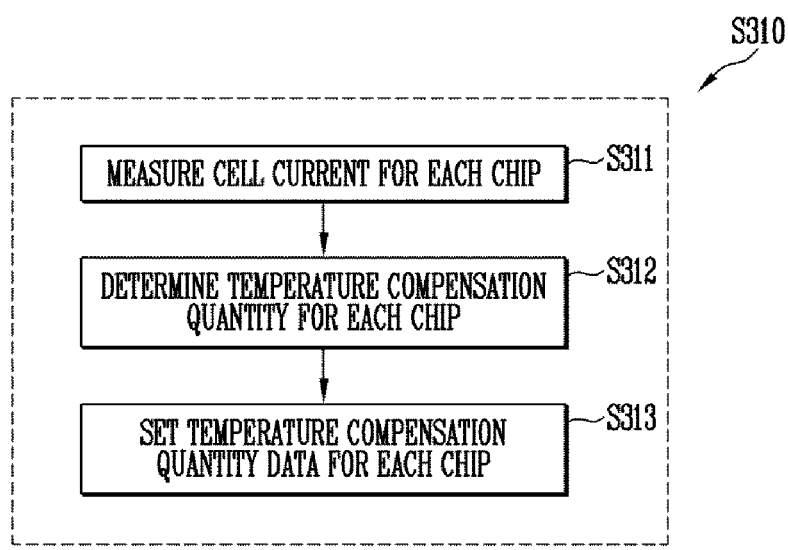
FIG. 7 is a flowchart for describing a method of setting temperature compensation data.

Referring to FIG. 7, a flowchart for describing a method of setting temperature compensation data is described.

An operating method of the memory system according to the invention will be described with reference to FIGS. 1 to 3, 6, and 7.

1) Set temperature compensation data for each chip (S310)

The semiconductor memory device 1100 including the plurality of semiconductor memory chips 100 sets temperature compensation data Temp_offset corresponding to each of the plurality of semiconductor memory chips 100.

This will be described in detail below.

1-1) Measure Cell Current for Each Chip (S311)

Each semiconductor memory chip 100 selects a part or an entirety of the memory clocks included in the memory cell array 110 and measures a cell current. A method of measuring the cell current includes a method of applying a measurement bias through the bit line and measuring the cell current through the common source line or a method of applying a measurement bias through the common source line and measuring the cell current through the page buffers PB1 to PBm electrically coupled with the bit line. The measured cell current is output to the control logic 140.

All of the memory blocks selected during a cell current measurement operation may be in an erase state or a programmed state. Otherwise, it is possible to measure the cell current in the erase state and the cell current in the programmed state.

The control logic 140 generates cell current information Id_chip about each semiconductor memory chip by using the measured cell current. The control logic 140 also outputs the generated cell current information Id_chip to the controller 1200.

1-2) Determine Temperature Compensation Quantity for Each Chip (S312)

The cell current information receiving unit 1220 of the controller 1200 temporarily stores the cell current information Id_chip received from each of the semiconductor memory chips 100. The cell current information receiving unit 1220 also then outputs the temporarily stored cell current information Id_chip to the temperature compensation quantity determining unit 1230.

The temperature compensation quantity determining unit 1230 determines a threshold voltage variation amount according to a temperature of each semiconductor memory chip 100 by using the cell current information Id_chip of each semiconductor memory chip 100. The temperature compensation quantity determining unit 1230 also determines the temperature compensation quantity of the read voltage of each memory chip 100.

The determination of the temperature compensation quantity according to the read cell current may be set as represented in Table 1 below.

TABLE 1

| Cell current(Id) | Temperature Compensation |
|---|---|
| Id > A | A |
| B < Id < A | $\alpha + \beta$ |
| C < Id < B | $\alpha + 2\beta$ |
| D < Id < C | $\alpha + 3\beta$ |
| E < Id < D | $\alpha + 4\beta$ |
| Id < E | $\alpha + 5\beta$ |

In this case, all of a basic compensation value $\alpha$ and an additional compensation value $\beta$ of the temperature compensation quantity are larger than 0.

When the measured cell current is increased, the threshold voltage variation amount according to a temperature is determined small. Further, when the measured cell current is decreased, a compensation quantity of the read voltage used during the read operation is set to be gradually increased.

1-3) Set Temperature Compensation Data for Each Chip (S313)

The temperature compensation quantity determining unit 1230 sets and outputs temperature compensation data Temp_offset corresponding to the temperature compensation amount of each semiconductor memory chip 100 for each semiconductor memory chip 100.

2) Store Set Temperature Compensation Data (S320)

The control logic 140 programs the temperature compensation data Temp_offset received from the controller 1200 in the CAM cell unit of the memory cell array 110 by controlling the address decoder 120, the read and write circuit 130, and the voltage generator 150.

3) Input a Read Command (S330)

When a read command is input from the host, the controller 1200 selects the semiconductor memory chips to perform the read operation. The controller 1200 also outputs a command CMD and a control signal CTRL according to the read operation.

4) Detect an Operation Temperature for Each Chip (S340)

The control logic 140 of the semiconductor memory chip 100 received the command CMD and the control signal CTRL selected by the controller 1200 and senses a current operation temperature of the semiconductor memory chip 100 by using the temperature detecting unit 141. The control logic 140 also outputs the temperature information Td_chip to the controller 1200.

5) Read Temperature Compensation Data (S350)

The control logic 140 of the semiconductor memory chip 100 selected to perform the read operation reads the temperature compensation data Temp_offset stored in the CAM cell unit of the memory cell array 110 and outputs the read temperature compensation data Temp_offset to the controller 1200 by controlling the address decoder 120, the read and write circuit 130, and the voltage generator 150.

6) Correct Read Voltage According to the Read Temperature Compensation Data (S360)

The read voltage setting unit 1240 sets a read voltage according to re-corrected temperature compensation data Temp_offset output from the temperature compensation quantity determining unit 1230 and outputs a control signal CTRL corresponding to the set read voltage.

The control logic 140 of the selected semiconductor memory chip 100 controls the voltage generator 150 in response to the control signal CTRL. The control logic 140 also adjusts a potential level of the read voltage Vread.

7) Read Operation (S370)

The control logic 140 performs a read operation on the memory cell array 110. The control logic 140 also outputs the read data to the controller 1200 by controlling the address decoder 120, the read and write circuit 130, and the voltage generator 150.

In an embodiment of the invention, it has been described that temperature compensation data is stored in each semiconductor memory chip, and then is read, and is output to the controller 120 to correct a read voltage during the read operation. However, the control logic 140 may correct the read voltage without reading the temperature compensation data and outputting the read temperature compensation data to the controller 1200. To this end, the control logic 140 may be configured to include the cell current information receiving unit 1210, the temperature data receiving unit 1220, the temperature compensation quantity determining unit 1230, and the read voltage setting unit 1240 of the controller 1200 illustrated in FIG. 3.

As described above, according to an embodiment of the invention, it is possible to improve reliability of the read operation by setting a read voltage of each semiconductor memory chip according to temperature compensation data corresponding to each of the plurality of semiconductor memory chips and performing the read operation. Further, it is possible to accurately predict a threshold voltage variation amount by setting temperature compensation data by measuring a cell current of each semiconductor memory chip and correcting the temperature compensation data according to an operation temperature during the read operation.

Figure 8:
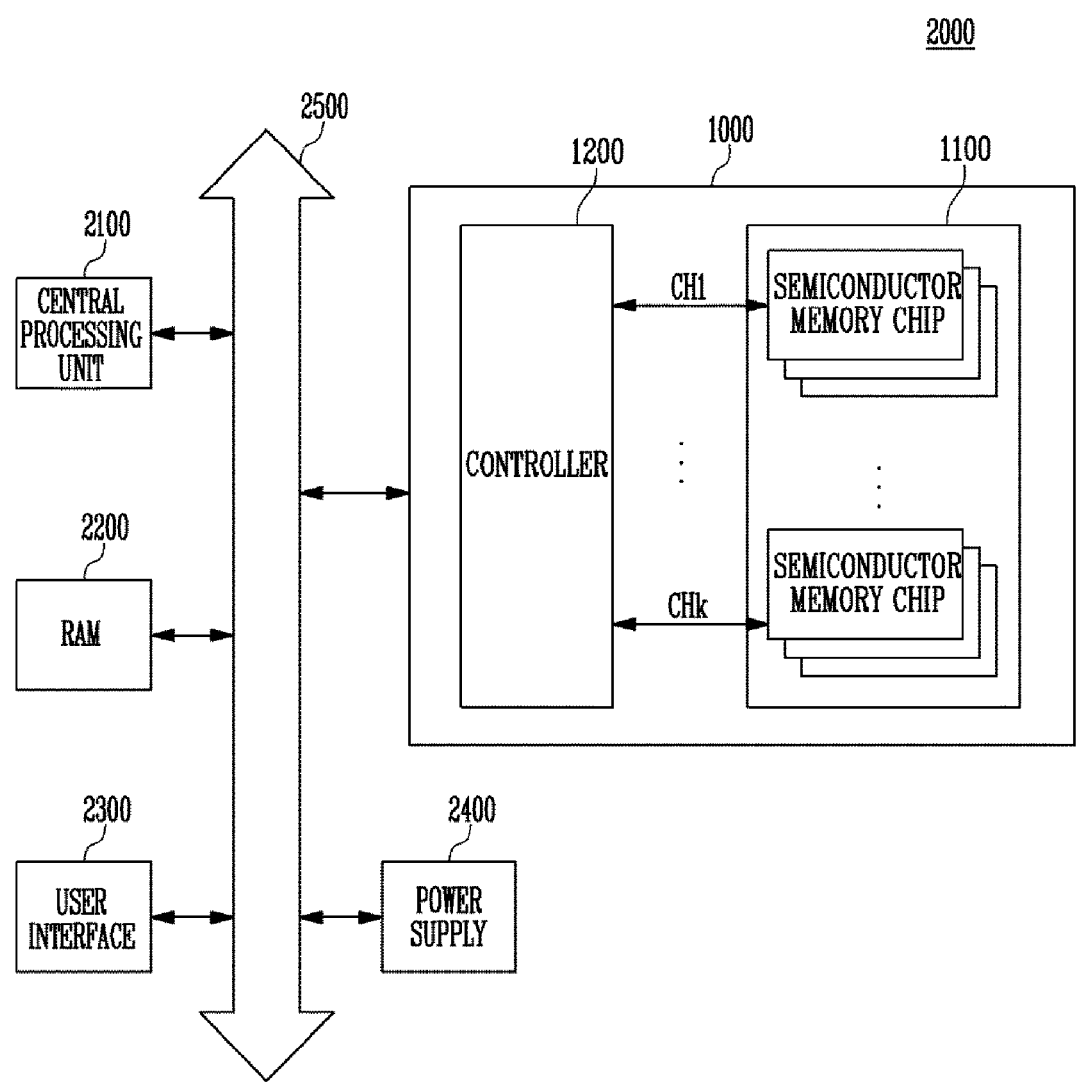
FIG. 8 is a block diagram illustrating a computing system including the memory system described with reference to FIG. 1.

Referring to FIG. 8, a block diagram illustrating a computing system including the memory system described with reference to FIG. 1 is described.

In FIG. 8, a computing system 2000 includes a central processing unit 2100, a Random Access Memory (RAM) 2200, a user interface 2300, a power supply 2400, a system bus 2500, and the memory system 1000.

The memory system 1000 is electrically coupled to the central processing unit 2100, the RAM 2200, the user interface 2300, and the power supply 2400 through the system bus 2500. Data provided through the user interface 2300 or processed by the central processing unit 2100 is stored in the memory system 1000.

The memory system 1000 may be configured and operated in a similar manner to that described with reference to FIG. 1.

As described above, an embodiment has been disclosed in the figures and the specification. The specific terms used herein are for purposes of illustration, and do not limit the scope of the invention defined in the claims. Accordingly, those skilled in the art will appreciate that various modifications and another equivalent example may be made without departing from the scope and spirit of the invention. Therefore, the sole technical protection scope of the invention will be defined by the technical spirit of the accompanying claims.

What is claimed is:

1. A memory system, comprising:
    a semiconductor memory device including a plurality of memory chips; and
    a controller configured to measure a cell current of each of the plurality of memory chips, generate temperature compensation data corresponding to the measured cell current, and store the generated temperature compensation data in each of the plurality of memory chips,
    wherein the controller includes:
        a cell current information receiving unit configured to receive cell current information from each of the plurality of memory chips and temporarily store the received cell current information; and
        a temperature compensation quantity determining unit configured to generate the temperature compensation data corresponding to each of the plurality of memory chips based on the cell current information stored in the cell current information receiving unit.

2. The memory system of claim 1, wherein the controller reads the temperature compensation data stored in a selected memory chip, which is to perform a read operation, among the plurality of memory chips, and sets a read voltage according to the read temperature compensation data during the read operation.

3. The memory system of claim 1, wherein each of the plurality of memory chips includes a plurality of memory blocks, measures cell currents of cell strings included in selected representative memory blocks among the plurality of memory blocks during a cell current measurement operation, and outputs information on the measured cell current to the controller.

4. The memory system of claim 1, wherein the controller further includes
    a read voltage setting unit configured to output a control signal for adjusting a read voltage according to the temperature compensation data.

5. The memory system of claim 4, wherein the controller further includes a temperature data receiving unit for receiving current operation temperature information from each of the plurality of memory chips, and temporarily stores the received current operation temperature information.

6. The memory system of claim 5, wherein the temperature compensation quantity determining unit corrects the temperature compensation data according to the current operation temperature information stored in the temperature data receiving unit.

7. The memory system of claim 1, wherein each of the plurality of memory chips includes:
    a memory cell array including a plurality of memory blocks;
    a peripheral circuit configured to store the temperature compensation data in a selected memory block among the plurality of memory blocks or read the stored temperature compensation data, and measure the cell current of the selected memory block during a cell current measurement operation; and
    a control logic configured to control the peripheral circuit to store or read the temperature compensation data, and sense the measured cell current and a current operation temperature and output the sensed measured cell current and the current operation temperature to the controller, or adjust a potential level of a read voltage in response to a control signal received from the controller.

8. The memory system of claim 1, wherein when the measured cell current is increased, a threshold voltage variation amount according to a temperature is decreased, and when the measured cell current is decreased, a compensation quantity of a read voltage used during a read operation is gradually increased.

9. A semiconductor memory device, comprising:
    a plurality of memory chips,
    wherein each of the plurality of memory chips include:
        a memory cell array including a plurality of memory blocks;
        a peripheral circuit configured to measure a cell current of a selected memory block among the plurality of memory cell blocks, and store temperature compensation data in one or more of the plurality of memory cell blocks; and
        a control logic configured to generate the temperature compensation data according to the measured cell current, and control the peripheral circuit to program the generated temperature compensation data in the one or more of the plurality of memory cell blocks,
    wherein when the measured cell current is decreased, a threshold voltage variation amount of memory cells included in the memory cell array according to a temperature is increased.

10. The semiconductor memory device of claim 9, wherein the control logic controls the peripheral circuit to read the temperature compensation data stored in the selected memory block during a read operation.

11. The semiconductor memory device of claim 10, wherein the control logic resets a read voltage according to the read temperature compensation data and a current operation temperature.

12. The semiconductor memory device of claim 11, wherein the control logic further includes a temperature detection unit configured to sense the current operation temperature.

13. The semiconductor memory device of claim 9, wherein the control logic included in each of the plurality of memory chips sets a read voltage corresponding to each of the plurality of memory chips according to the measured cell current of each of the plurality of memory chips.

14. A method of a memory system, comprising:
- measuring a cell current for each of a plurality of memory chips;
- generating temperature compensation data corresponding to each of the plurality of memory chips according to the measured cell current;
- storing the temperature compensation data in each of the plurality of memory chips; and
- reading the temperature compensation data stored in each of the plurality of memory chips, setting a read voltage of each of the plurality of memory chips according to the read temperature compensation data, and performing the read operation, wherein the temperature compensation data is generated so that when the cell current is decreased, a compensation quantity of the read voltage is increased.

15. The method of claim 14, wherein the measuring of the cell current includes measuring cell currents of selected memory blocks among a plurality of memory blocks included in each of the plurality of memory chips.

16. The method of claim 15, wherein the measuring of the cell current includes:
- applying a bias to a common source line of the selected memory blocks, and then measuring the cell current through a page buffer electrically coupled with the selected memory blocks, or
- applying the bias to bit lines electrically coupled with the selected memory blocks, and then measuring the cell current through the common source line.

17. The method of claim 14, wherein the setting of the read voltage includes setting the read voltage based on the temperature compensation data and a current operation temperature of one of the memory chips among the plurality of memory chips.

18. The method of claim 14, further comprising:
- sensing a current quantity by a plurality of page buffers and outputting the sensed current quantity as cell current information.

* * * * *